US012782825B2

(12) United States Patent
Hsu et al.

(10) Patent No.: US 12,782,825 B2
(45) Date of Patent: Nov. 3, 2026

(54) DIFFRACTION-BASED PUPIL DETERMINATION FOR OPTIMIZATION OF LITHOGRAPHIC PROCESSES

(71) Applicant: ASML NETHERLANDS B.V., Veldhoven (NL)

(72) Inventors: Duan-Fu Stephen Hsu, San Jose, CA (US); Jialei Tang, San Jose, CA (US); Dezheng Sun, Palo Alto, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 100 days.

(21) Appl. No.: 18/859,488

(22) PCT Filed: May 1, 2023

(86) PCT No.: PCT/EP2023/061435
§ 371 (c)(1),
(2) Date: Oct. 23, 2024

(87) PCT Pub. No.: WO2023/222368
PCT Pub. Date: Nov. 23, 2023

(65) Prior Publication Data

US 2025/0264808 A1 Aug. 21, 2025

Related U.S. Application Data

(60) Provisional application No. 63/343,041, filed on May 17, 2022.

(51) Int. Cl.
*G03F 7/00* (2006.01)
*G03F 1/68* (2012.01)

(52) U.S. Cl.
CPC ............ *G03F 7/70504* (2023.05); *G03F 1/68* (2013.01); *G03F 7/7025* (2013.01)

(58) Field of Classification Search
CPC ...... G03F 1/68; G03F 7/70125; G03F 7/7025; G03F 7/70308; G03F 7/705; G03F 7/70504
See application file for complete search history.

(56) References Cited

U.S. PATENT DOCUMENTS 5,229,872 A 7/1993 Mumola
6,046,792 A 4/2000 Van Der Werf et al.
(Continued)

FOREIGN PATENT DOCUMENTS

WO 2019/072703 4/2019
WO 2020/141052 7/2020
WO 2020/182440 9/2020

OTHER PUBLICATIONS

International Search Report and Written Opinion issued in corresponding PCT Patent Application No. PCT/EP2023/061435, dated Jul. 19, 2023.

(Continued)

*Primary Examiner* — Peter B Kim
(74) *Attorney, Agent, or Firm* — Pillsbury Winthrop Shaw Pittman LLP

(57) ABSTRACT

Methods, apparatuses, and software are disclosed for optimization of a source and/or mask as used in lithographic manufacturing and patterning processes. One method includes determining a first pupil having a central obscuration (CO), determining a diffraction order (DO) based on a target design and a mask model, determining a first diffraction pattern (DP) based on the DO and the first pupil, the first DP including overlapping regions of diffracted light, determining a second DP based on the DO and the first pupil, and determining an initial pupil based on the first DP and the second DP, the initial pupil including at least some of the overlapping regions.

20 Claims, 18 Drawing Sheets

(56) References Cited

U.S. PATENT DOCUMENTS

| | | | |
|---|---|---|---|
| 10,459,346 B2 | 10/2019 | Hsu et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0162197 A1 | 6/2010 | Ye et al. | |
| 2010/0180251 A1 | 7/2010 | Ye et al. | |
| 2018/0120709 A1 | 5/2018 | Hsu et al. | |
| 2023/0047402 A1* | 2/2023 | Hsu | G03F 1/36 |

OTHER PUBLICATIONS

B. Kneer et al., “EUV lithography optics for sub 9 nm resolution”, Proc. of SPIE, vol. 9422, pp. 1-10 (2015).

T. Yang et al., “Effect of central obscuration on image formation in projections lithography”, Proc. of SPIE, vol. 1264, pp. 477-485 (1990).

Socha, “Freeform and SMO”, Proc. of SPIE, vol. 7973, pp. 1-17 (2011).

* cited by examiner

DIFFRACTION-BASED PUPIL DETERMINATION FOR OPTIMIZATION OF LITHOGRAPHIC PROCESSES

CROSS-REFERENCE TO RELATED APPLICATIONS

This application is the U.S. national phase entry of PCT Patent Application No. PCT/EP2023/061435 which was filed on May 1, 2023, which claims priority of U.S. Provisional Application No. 63/343,041 which was filed on May 17, 2022 and which is incorporated herein in its entirety by reference.

TECHNICAL FIELD

The description herein relates generally to determining a pupil for optimization of a source and mask as used in lithographic manufacturing and patterning processes. More particularly, the disclosure includes apparatus, methods, and computer programs for determining a pupil that includes accounting for diffraction effects.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g., comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1\times\lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Methods, apparatuses, and software are disclosed for determining a pupil for optimization of a source and/or mask as used in lithographic manufacturing and patterning processes. In one aspect, a method of determining a source for a lithography process including: determining a first pupil having a central obscuration (CO); determining a diffraction order (DO) based on a target design and a mask model; determining a first diffraction pattern (DP) based on the DO and the first pupil, the first DP including overlapping regions of diffracted light; determining a second DP based on the DO and the first pupil; and determining an initial pupil based on the first DP and the second DP, the initial pupil including at least some of the overlapping regions.

In some variations, the method can include performing source-mask-optimization (SMO) initialized with the initial pupil. The initial pupil may not include any of the diffracted light in the CO. SMO can be performed with the constraint that any pupil resulting from the SMO excludes the CO.

In other variations, the first pupil can be determined for a lithography system having a numerical aperture of at least 0.45 for an isomorphic system with a chief ray angle (CRAO) less than or equal to 9. The first pupil can be determined for a lithography system having a numerical aperture of at least 0.5 for an anamorphic (4×8) lithography system.

In yet other variations, central obscuration can be a circle, an oval, or a rectangle. The mask model can be a thick mask model.

In some variations, the DO can include first order diffraction light at closest DO peak locations to a zeroth order DO peak location. The DO can include the closest first order diffraction light at DO peak locations orthogonal to the zeroth order DO peak location. The method can include determining DO peak locations based on local peaks of a DO array, where the DO is determined based on the DO peak locations. The amplitudes of the DO can be based on the sums of all amplitudes in corresponding local DO areas. In other variations, the initial pupil can be contained within a sigma between-NA and +NA.

In other variations, the method can include discretizing the DOs and utilizing the first pupil with a discrete amplitude to generate the second DP to have discretized amplitudes. The discrete amplitudes of the DOs and the first pupil can each set be to 1. The first DP can indicate the number of overlapped diffraction beams. The initial pupil can be determined based on a degree of overlap in the overlapping regions of the first DP.

In yet other variations, the method can also include generating a normalized DP based on the degree of overlap exceeding a threshold, wherein the overlapping regions that exceed the threshold for the degree of the degree of overlap are set to have a value of 1 and all other regions in the normalized DP are set to have a value of 0; and multiplying the normalized DP by the second DP to generate the initial pupil.

In some variations, the initial pupil can be determined based on a highest degree of overlap in the overlapping regions of the first DP. The method can include determining DO amplitudes for the DO, where the initial pupil is filled where the summed amplitudes of the first DP exceeds a threshold of diffraction pattern overlap.

In other variations, the method can include determining overlapped regions of the initial pupil; generating the initial pupil to include only the most overlapped regions when including only the most overlapped regions meet or exceed a pupil fill ratio threshold; and iteratively adding next most overlapped regions to the initial pupil when the initial pupil does not meet or exceed the pupil fill ratio threshold.

In some embodiments, there can be a non-transitory computer readable medium having instructions recorded thereon for determining a pupil for optimization of a source and/or mask as used in lithographic manufacturing and patterning processes, the instructions when executed by a computer having at least one programmable processor cause operations comprising any of the operations in the above method embodiments.

In some embodiments, there can be a system for determining a pupil for optimization of a source and/or mask as used in lithographic manufacturing and patterning processes, the system comprising: at least one programmable processor; and a non-transitory computer readable medium having instructions recorded thereon, the instructions when executed by a computer having the at least one programmable processor cause operations comprising any of the operations in the above method embodiments.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
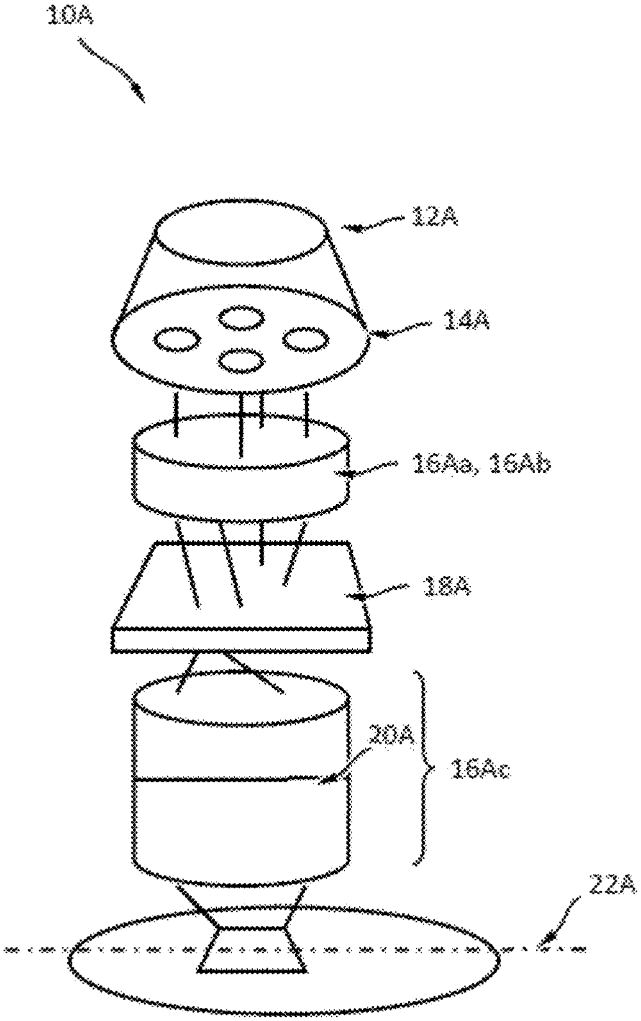
FIG. 1 illustrates a block diagram of various subsystems of a lithographic projection apparatus, according to an embodiment of the present disclosure.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment of the present disclosure. Major components are a radiation source 12A, which may be a deep-ultraviolet excimer laser source or other type of source including an extreme ultraviolet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta$max), wherein n is the refractive index of the media between the substrate and the last element of the projection optics, and $\Theta$max is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
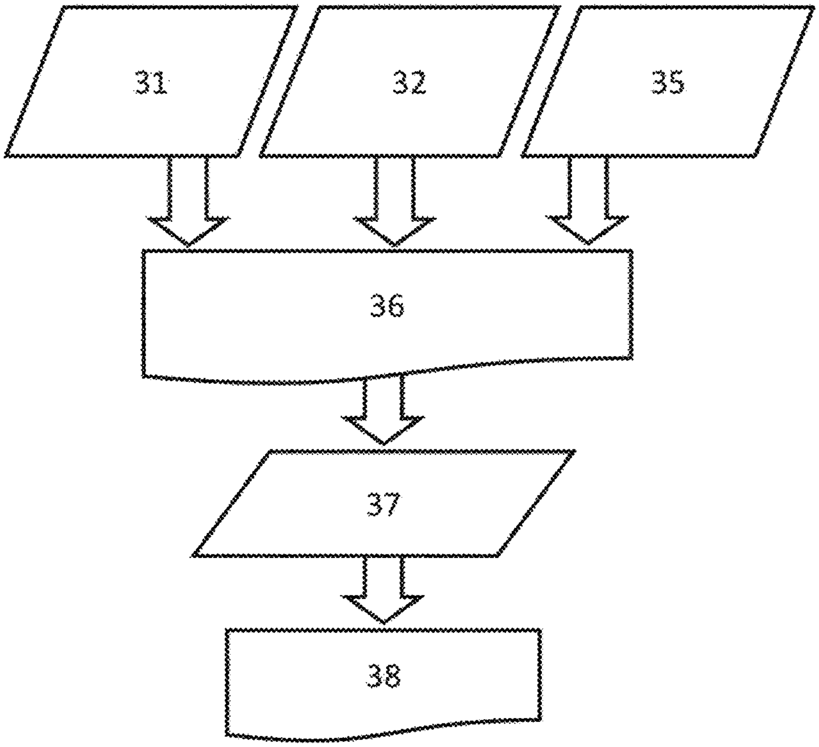
FIG. 2 illustrates an exemplary flow chart for simulating lithography in a lithographic projection apparatus, according to an embodiment of the present disclosure.

FIG. 2 illustrates an exemplary flow chart for simulating lithography in a lithographic projection apparatus, according to an embodiment of the present disclosure. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g., off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" means a process that creates an etched substrate by the application of specified patterns of light as part of a lithography process.

As used herein, the term "target pattern" means an idealized pattern that is to be etched on a substrate.

As used herein, the term "printed pattern" means the physical pattern on a substrate that was formed based on a design layout. The printed pattern can include, for example, vias, contact holes, troughs, channels, depressions, edges, or other two and three dimensional features resulting from a lithography process.

As used herein, the term "process model" means a model that includes one or more models that simulate a patterning process. For example, a process model can include any combination of: an optical model (e.g., that models a lens system/projection system used to deliver light in a lithography process and may include modelling the final optical image of light that goes onto a photoresist), a mask model, a resist model (e.g., that models physical effects of the resist, such as chemical effects due to the light), an OPC model (e.g., that can be used to make design layouts and may include sub-resolution resist features (SRAFs), etc.), an imaging device model (e.g., that models what an imaging device may image from a printed pattern).

As used herein, the term "imaging device" means any number or combination of devices and associated computer hardware and software that can be configured to generate images of a target, such as the printed pattern or portions thereof. Non-limiting examples of an imaging devices can include: scanning electron microscopes (SEMs), x-ray machines, etc.

Figure 3:
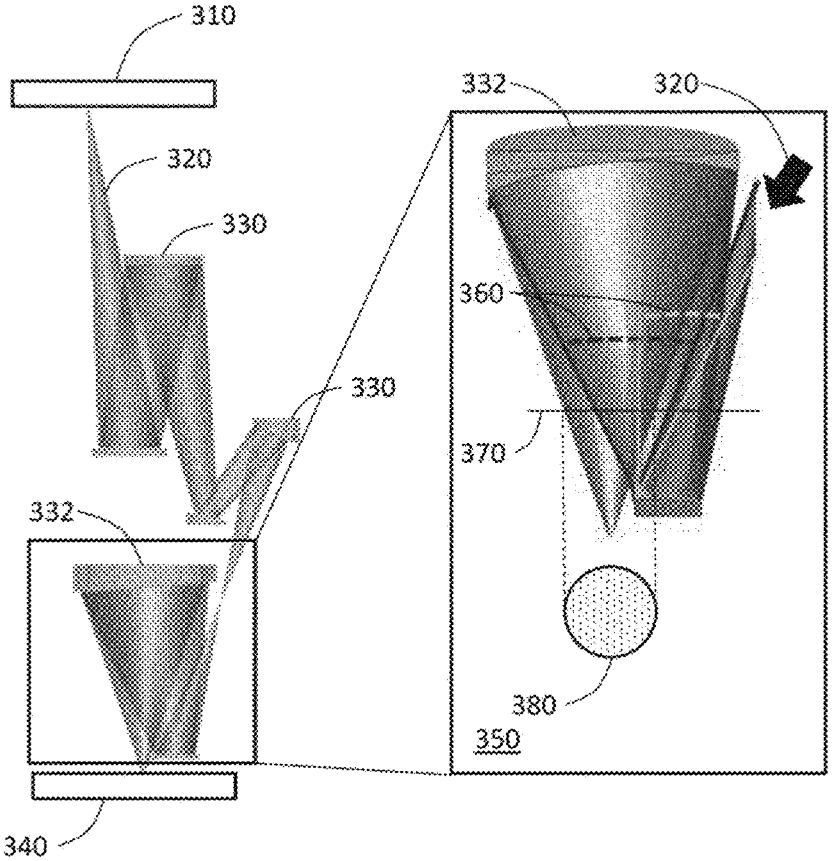
FIG. 3 illustrates an exemplary portion of a lithographic projection apparatus with an unobscured pupil, according to an embodiment of the present disclosure.

FIG. 3 illustrates an exemplary portion of a lithographic projection apparatus with an unobscured pupil, according to an embodiment of the present disclosure.

During a patterning process, light from a lithography source (e.g., UV, EUV, etc.) can be directed to and/or through numerous optical components such as lenses, a mask, mirrors, etc. to ultimately reach a substrate being processed (e.g., a wafer). A portion of a lithography system is shown in FIG. 3 that includes mask 310 receiving light 320 from a source (not shown—though radiation source 12A in FIG. 1 is one example). Light 320 is directed through a series of optical elements such as mirrors 330 to ultimately arrive at substrate 340. The expanded view 350 on the right depicts one embodiment showing the two of mirrors 330 and the angles 360 between rays of incoming light that fill the last mirror 332. Such angles can be related to the numerical aperture (NA) of the system. Also shown is pupil plane 370 and a simplified depiction of a pupil 380. As is understood in the art, a pupil represents the pattern of the light at a particular location along the optical axis. While this pattern may be at the location of a physical pupil, if one exists in a given system, it may in general be at any arbitrary location.

In the example shown, pupil 380 is unobscured and thus can theoretically have light at any portion of the pupil. While such unobstructed pupils may work for comparatively low NA systems, different pupils may be required for higher NA systems. The present disclosure refers to high-NA and low-NA systems merely to distinguish over the other. Accordingly, such designations do not imply or require any particular value of NA. In some embodiments, a low-NA system may have an NA of approximately 0.33, whereas a high-NA system may have an NA of approximately 0.5.

Figure 4:
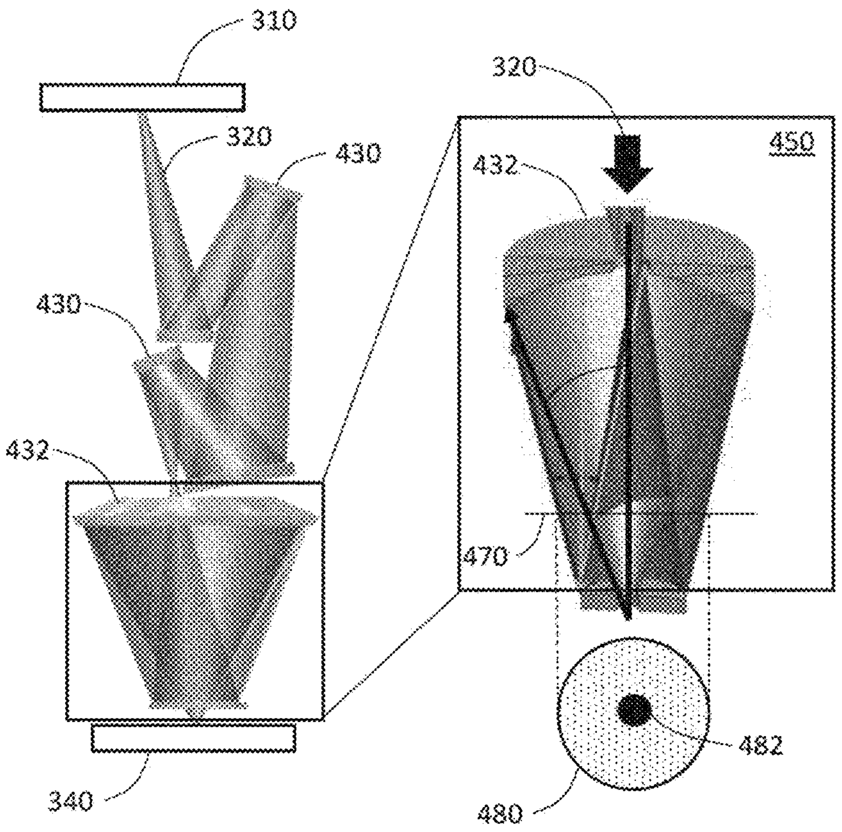
FIG. 4 illustrates an exemplary portion of a lithographic projection apparatus with a pupil having a central obscuration, according to an embodiment of the present disclosure.

FIG. 4 illustrates an exemplary portion of a lithographic projection apparatus with a pupil having a central obscuration, according to an embodiment of the present disclosure.

High-NA systems, such as the example depicted in FIG. 4, can provide numerous technical advantages, including increasing the resolution of light pattern reaching the substrate. Such high-NA systems can have quite different optical components (e.g., mirrors 430) and configurations than their low-NA counterparts. This is seen in the example of FIG. 4 by, for example, the last mirror 432 being larger than the corresponding last mirror 332 in the low-NA system depicted in FIG. 3. A technical challenge in EUV lithography is that EUV mirror coatings can only accurately reflect light over a comparatively small angle, which a high-NA system may exceed. One solution is depicted in FIG. 4 by the system causing a central obscuration (CO) 482 to be present at pupil 480. One effect of a CO can be to cause the light reaching the EUV mirror to be at smaller angles and thereby be able to be accurately reflected. Accordingly, the disclosed high NA projection optics can permit a pupil with a CO that increases the transmission of the system due to the angular reduction.

In some embodiments, the pupil can be determined for a lithography system having a numerical aperture of at least 0.45 for an isomorphic system with a chief ray angle (CRAO) less than or equal to 9. In other embodiments, the pupil can be determined for a lithography system having a numerical aperture of at least 0.5 for an anamorphic (4×8) lithography system.

Figure 5A:
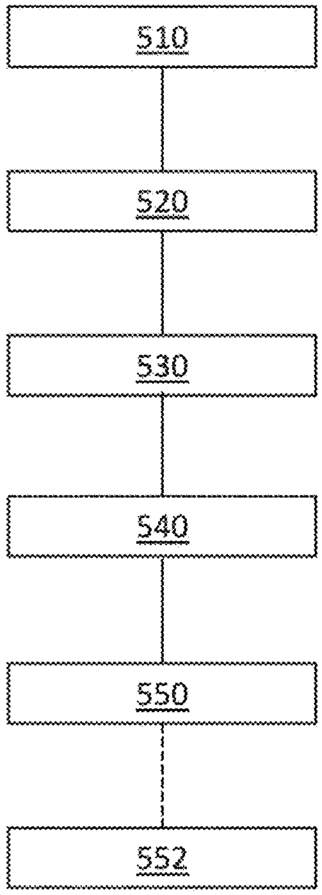
FIG. 5A illustrates an exemplary process flow diagram for determining a source for a lithography process, according to an embodiment of the present disclosure.

FIG. 5A illustrates an exemplary process flow diagram for determining a source for a lithography process, according to an embodiment of the present disclosure.

To provide for determining an optimized system that can deliver light as needed to the substrate, the system can be computationally optimized to determine the best combination of source, mask, and optionally other aspects of the lithography system. Such source-mask optimization (SMO) can thereby determine the best combination of a light source and mask design and account for the physical constraints of the optical system, desired process windows, etc. The pupil can be a factor in SMO and the light at the pupil can include diffracted light of varying orders that can combine at the substrate. Accordingly, the present disclosure provides a method of determining a source, mask, or other optimized aspect of a system for a lithography process. While various aspects of the below method and other features of the present disclosure are discussed in greater detail herein, in one embodiment, shown by the diagram in FIG. 5A, a method can include, at 510, determining a first pupil having a central obscuration, e.g., as depicted by the example pupil 480 in FIG. 4. At 520, the method can include determining a diffraction order (DO) based on a target design and a mask model. The DO can be utilized to determine how patterns of diffracted light overlap across first pupil 510. The method can then include, at 530, determining a first diffraction pattern (DP) based on the DO and the first pupil, the first DP including overlapping regions of diffracted light, or DO overlapped regions. As the pupil represents the pattern of light at a location along the optical axis, the diffraction patterns described herein can then represent overlapped light forming the pupil. At 540, the method can include determining a second DP based on the DO and the first pupil. The second DP can include information on the amplitudes of the regions of the second DP (e.g., the amplitude of the zeroth-order peak, first order peaks, and so on). The method can also include, at 550, determining an initial pupil based on the first DP and the second DP, the initial pupil including at least some of the overlapping regions. The first DP and second DP can be multiplied to generate an initial pupil. However, in other embodiments, some specific overlapping regions of the first DP can be extracted and normalized to form a normalized DP, with the normalized DP multiplied by the second DP to generate the initial pupil. In some embodiments, the initial pupil does not include any of the diffracted light in the central obscuration. As described in greater detail herein, some embodiments can include requiring sufficiently overlapped regions to deliver the needed light. Also, some embodiments may benefit by enforcing that no light be determined (e.g., by the SMO process) to be in the CO.

As used herein, the term "first" pupil refers to the pupil being determined by the disclosed methods but prior to being utilized by the SMO system. The term "initial" pupil refers to the pupil that can be provided to the SMO system, and in some embodiments used to begin an SMO. Such an "initial pupil" has generally been determined from the "first pupil," as described herein.

Also, as described further herein, some embodiments of the method can include, at 552, performing source-mask-optimization (SMO) initialized with the initial pupil.

Because some optimizers will find solutions with light in the CO, which may not be desired for at least the reasons given above, certain embodiments can perform SMO with the constraint that any pupil resulting from the SMO excludes the CO.

Figure 5B:
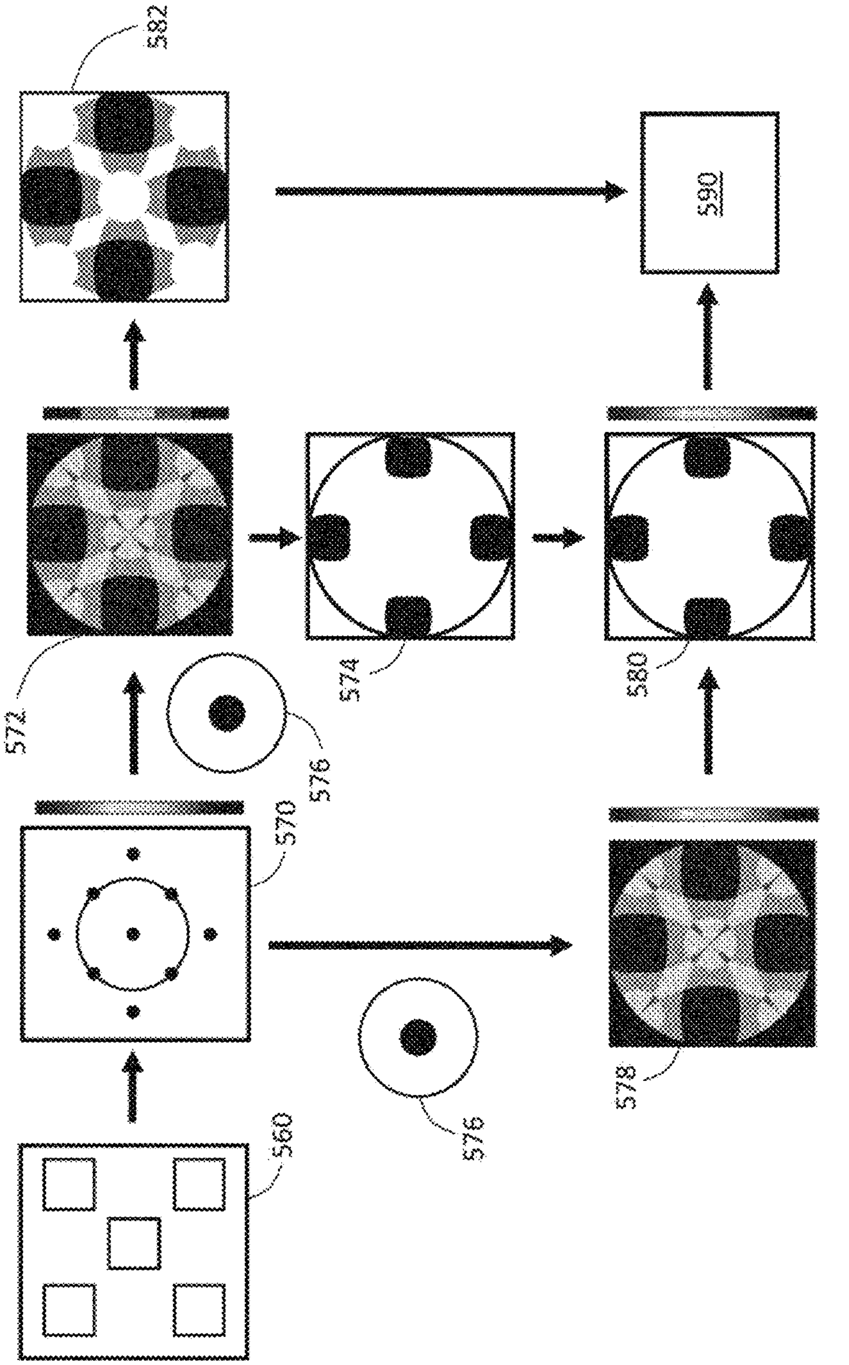
FIG. 5B illustrates an exemplary process flow diagram for utilizing diffraction patterns in initializing an SMO, according to an embodiment of the present disclosure.

FIG. 5B illustrates an exemplary process flow diagram for utilizing diffraction patterns in initializing an SMO, according to an embodiment of the present disclosure.

In an embodiment, a flow for utilizing diffraction patterns in determining an initial pupil for SMO can include the following, with details provided further herein according to some of the noted examples.

The flow depicted in FIG. 5B can begin with a device pattern 560, e.g., having given pitches, CDs, I. A mask model can be applied to the device pattern to generate a DO 570 (see also, e.g., FIG. 7). DO 570 is shown with only the zero-order diffraction region at the center and the locations of first order diffraction peaks. DO 570 may be determined to have continuous (i.e., not discrete) amplitudes at the various diffraction order peak locations. See also, 520 in FIG. 5A.

A first DP 572 can be generated to indicate regions of overlapping diffraction orders. First DP 572 can be based on the diffraction due to first pupil 576 having the CO. The amplitudes in first DP 572 may be set to have discrete values, such as integers, as shown to directly indicate regions of overlap (see also, e.g., FIG. 8), but in some embodiments the amplitudes can be set to continuous values based on determined amplitudes (see also, e.g., FIG. 7). In some embodiments, certain overlapping regions can serve as the regions utilized for an initial pupil for the SMO process. In such embodiments, as described in further detail below, a normalized DP 574 can then be generated (see also 1120 in FIG. 11), e.g., having regions with light normalized to a value of 1 and regions without assigned a value of 0. See also, 530 in FIG. 5A.

Figure 6:
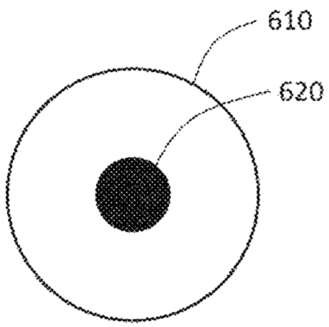
FIG. 6 illustrates an exemplary first pupil having a central obscuration, according to an embodiment of the present disclosure.
Figure 8:
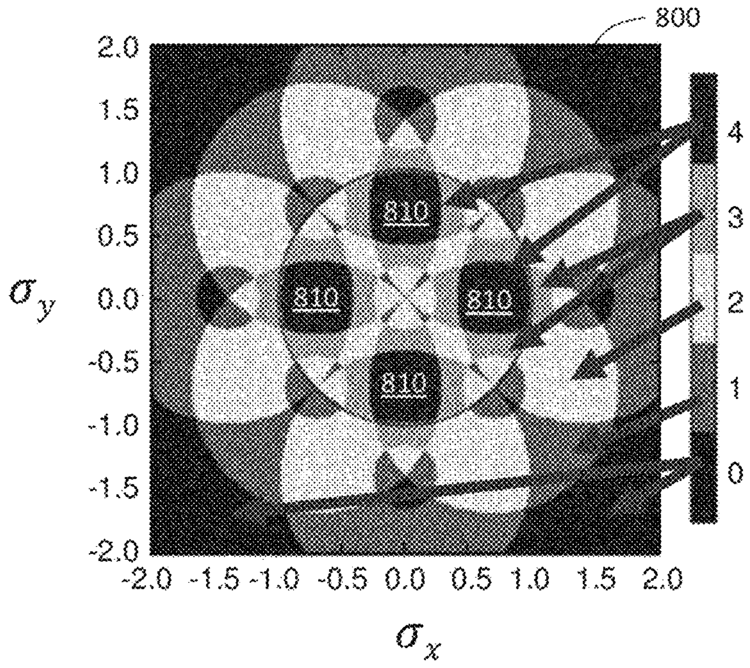
FIG. 8 illustrates an exemplary second diffraction pattern, according to an embodiment of the present disclosure.

A second DP 578 can be generated by convolving DO 570 with first pupil 576 (see also, e.g., FIG. 6 and FIG. 8). In this embodiment, the second DP 578 can be continuous (i.e., having continuous amplitudes from the continuous DO 570 peak amplitudes). See also, 510 and 540 in FIG. 5A.

In one embodiment, the initial pupil 580 can be determined from the first DP 572 (utilized to generate the normalized DP 574) and the second DP 578. See also, 550 in FIG. 5A. In some embodiments, this can include generating a normalized DP 574 based on the degree of overlap exceeding a threshold, where overlapping regions that exceed the threshold for the degree of the degree of overlap can be set to have a value of 1 and all other regions in the normalized DP 574 can be set to have a value of 0. Then, to generate the initial pupil 580, the second DP 578 can be multiplied by the normalized DP 574.

Initial pupil 580 can thus be continuous in amplitude but can have regions determined based on discretization of the diffraction order amplitudes. In other embodiments, such as described in FIG. 8, the amplitudes of the second DP 578 can be discretized so as to provide an initial pupil with discrete amplitudes. Initial pupil 580 can then be provided to begin the SMO process 590. See also, 552 in FIG. 5A.

Figure 11:
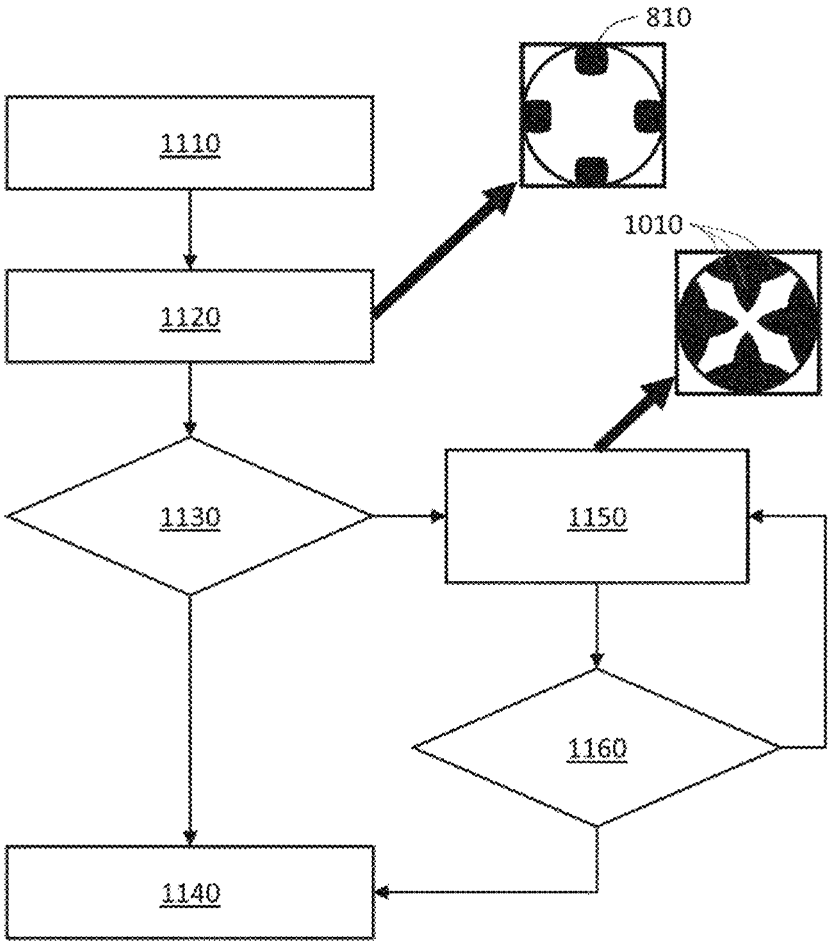
FIG. 11 illustrates determining an exemplary initial pupil based on a pupil fill ratio, according to an embodiment of the present disclosure.

In some embodiments, such as to satisfy a pupil fill ratio constraint during SMO, other regions of the second DP 578 can be included such as the next most overlapped regions (see also, e.g., 1150 in FIG. 11). This is shown by the example second normalized DP 582 and depicts a more-filled pupil (compared to normalized DP 574).

FIG. 6 illustrates an exemplary first pupil having a central obscuration, according to an embodiment of the present disclosure.

The exemplary methods described above (and throughout the present disclosure, e.g., at 510 in the method depicted in FIG. 5A) can determine a pupil 610 that includes a central obscuration 620. Pupil 610 can then serve as the basis for the diffraction order-based pupil determination described herein. Pupil 610 can be a pupil generated from a library of pupils or a user-input pupil design. In general, the central obscuration can be an arbitrary shape. In the examples depicted herein, an embodiment where the central obscuration is a circle is depicted. In other embodiments, the central obscuration can be, for example, an oval, rectangle, an ellipse, a polygon, or an irregular shape.

Figure 7:
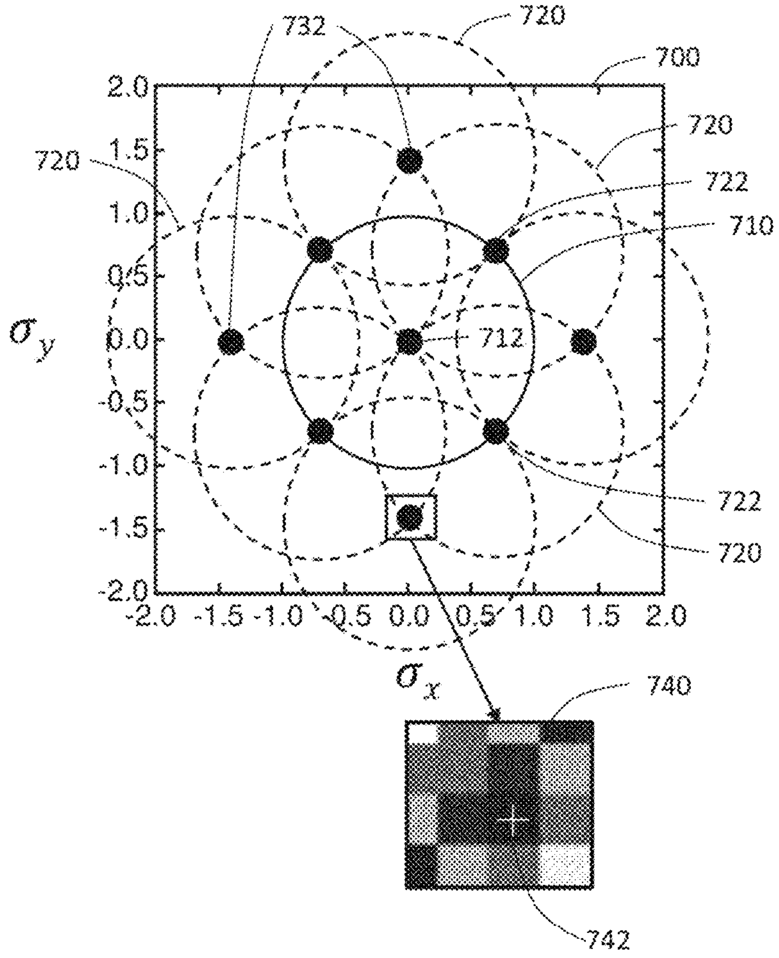
FIG. 7 illustrates an exemplary map of diffraction orders, according to an embodiment of the present disclosure.

FIG. 7 illustrates an exemplary map of diffraction orders, according to an embodiment of the present disclosure.

The above method at 520 describes determining a diffraction order (DO) 700 based on a target design and a mask model. In some embodiments, the mask model can be a thick mask model, such as one that can account for light interacting with various depths in the mask. Because light is diffracted from different depths and locations in the mask, the locations of the diffraction orders at the pupil can vary. FIG. 7 depicts diffraction order locations as a function of σ:

$$\sigma = \frac{NA_{condenser}}{NA_{objective}}. \quad \text{(Eq. 2)}$$

The zeroth order diffraction light 710 (solid circle) with a zeroth order DO peak location 712 is shown in the center of the plot. Additionally, other diffraction orders and their respective locations can be accounted for when determining a diffraction pattern that contributes light to the pupil. The DO can also include first order diffraction light 720 (dashed circles) at closest DO peak locations 722 to a zeroth order DO peak location 712. The DO can also include the closest first order diffraction light 720 at DO peak locations 732 orthogonal to the zeroth order DO peak location. As will be discussed further herein, it can be seen that light within σ=1 can include overlapping patterns of diffracted light.

In some embodiments, various methods can also include determining DO peak locations based on local peaks of a DO array, wherein the DO is determined based on the DO peak locations in a local DO area 740. A DO array can be a data representation of any of the diffraction patterns described herein, e.g., a 2D array of values stored in computer memory. A portion of an exemplary DO array is depicted in the inset where, for example, the greyscale tone represents the amplitude of a diffraction peak, which can have a complex 2-D pattern. The pixelated representations of the diffraction amplitude can be utilized to assign specific amplitudes to particular pixels in the DO representation. Accordingly, the pixel 742 with the largest DO (depicted by the darkest pixel shown in the inset) can be selected to be the DO peak location (shown by the white crosshair). The local DO area utilized can include any extents around the location where the DO peak location is expected to be. In some embodiments, the amplitudes of the DO can be based on the sums of all amplitudes in corresponding local DO areas, the amplitude of the local DO peak, etc. For example, in various embodiments, local DO areas can include ±0.03 s, ±0.05 s, etc. about a DO peak location.

FIG. 8 illustrates an exemplary second diffraction pattern, according to an embodiment of the present disclosure.

In some embodiments, the disclosed methods can include convolving the initial pupil 610 with the DO 700 to determine the depicted second DP 800. Throughout second DP 800 the zeroth order diffraction 710 and numerous first order diffraction 720 overlap in many places to generate a second DP 800 with a range of amplitudes. As one example, the amplitude of light in second DP 800 is most overlapped in locations 810. Areas immediately adjacent locations 810 have three diffraction patterns overlapping, etc.

As shown in the example embodiment of FIG. 8, some disclosed methods can include discretizing the DO 700 and utilizing the first pupil 610 with a discrete amplitude to generate second DP 800 to have discretized amplitudes. As one example, the discrete amplitudes of the DOs and the first pupil 610 can each be set to 1. This is depicted by the scale with the arrows indicating some regions of second DP 800 having the total amplitude shown. The act of discretizing the amplitudes of first pupil 610 and DO 700 can provide several technical advantages. For example, such can reduce the computation time by allowing the system to perform integer operations rather than floating-point operations. Also, because of the discrete nature of DOs (DOs can be considered discrete points well separated in sigma space), it is easy and convenient to do discretization for DO images. Once a discretized DO is achieved, discretized second DP 800 can be formed accordingly and used for accurate source region of interest calculations, for example, without having to resort to heuristic threshold binarization and dilation such as disclosed in PCT/EP2020/054545. This can combine synergistically with implementations where, due to the pupil design being guided by diffractive effects rather than being an arbitrary design, the SMO process can more rapidly converge to an accurate solution thereby reducing computational overhead as compared to prior methods. Accordingly, in some embodiments, various methods can include determining a discretized DO by discretizing DO amplitudes for DO 700. The method can also include determining a discretized initial pupil by setting a pupil amplitude of the first pupil to a discrete value. Then, determination of the second DP 800 can be with the discretized DO and the discretized first pupil. While setting amplitudes to 1 is one example of discretization, any values could be selected, e.g., 0.5, 1.5, 2, etc.

Figure 9:
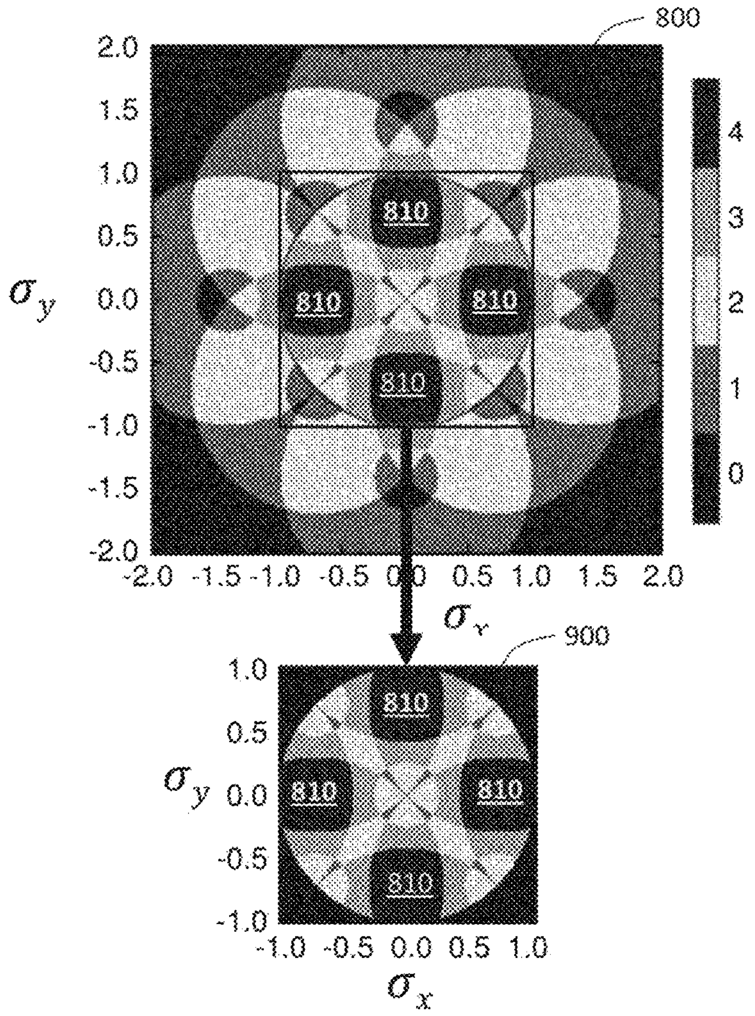
FIG. 9 illustrates an exemplary first diffraction pattern in a region of interest, according to an embodiment of the present disclosure.

FIG. 9 illustrates an exemplary second diffraction pattern in a region of interest, according to an embodiment of the present disclosure.

Earlier figures (e.g., FIG. 8) depicted an overlapping second DP 800 covering a range of ±2NA in sigma space. In some embodiments, the region of interest 900 of an initial pupil can be contained within a sigma between −NA and +NA. In other embodiments, the second DP can be determined over any other extents that can be utilized by the SMO system, e.g., ±1.5NA, ±0.5NA, etc.

Figure 10:
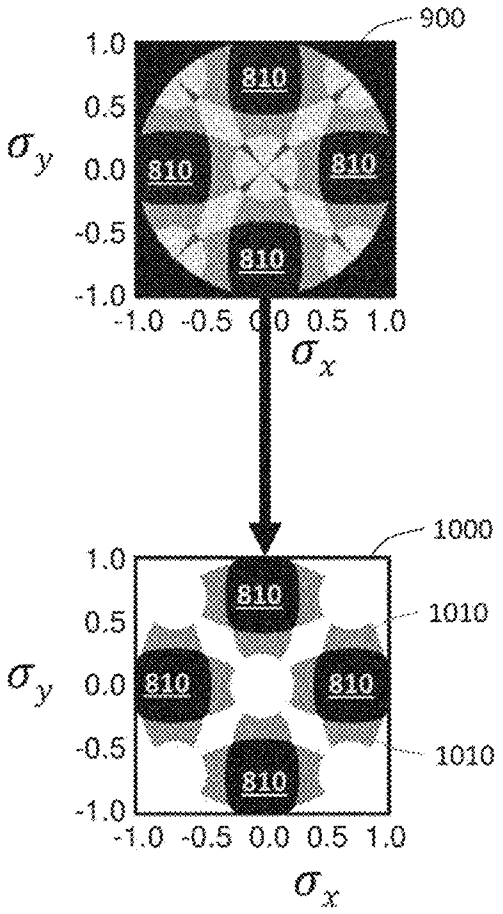
FIG. 10 illustrates determining an exemplary initial pupil based on overlapped regions in a first diffraction pattern, according to an embodiment of the present disclosure.

FIG. 10 illustrates determining an exemplary pupil based on overlapped regions of DOs in a first diffraction pattern, according to an embodiment of the present disclosure.

As shown in the region of interest 900, the first DP (e.g., first DP 572) can indicate the number of overlapped diffraction beams and this can serve as a measure of light that can be utilized in the pupil. In particular, the initial pupil can be determined based on a degree of overlap in the overlapping regions of the first DP. A "degree of overlap" can be a numerical value as previously described (e.g., 4, 3, 2, etc.) or can be relative (e.g., highest, next highest, etc.). In some embodiments, the initial pupil can be determined based on a highest degree of overlap in the overlapping regions of the first DP. In this example, based on region of interest 900, the pupil would only have light in regions where the amplitude was 4—the highest degree of overlap in the discretized example.

Another embodiment is shown in FIG. 10, where pupil 1000 includes regions having a degree of overlap exceeding a threshold. For example, such methods can include determining DO amplitudes for the DO, where the initial pupil can be filled where the summed amplitudes of the first DP exceed a threshold of diffraction pattern overlap. In this example, pupil 1000 can include not just locations 810 (having amplitude 4) but also adjacent regions 1010 (having amplitude 3).

FIG. 11 illustrates determining an exemplary initial pupil based on a pupil fill ratio, according to an embodiment of the present disclosure.

In a related embodiment, the determination of regions to be included in the pupil can be based on a pupil fill ratio, defined herein as the integrated intensity of the filled light divided by the maximum pupil intensity times the total number of pixels in the pupil. In the case when all of amplitudes of filled pupil points are the same, the pupil fill ratio is approximately the percentage of the pupil that is filled with light.

A method for such an embodiment is depicted in FIG. 11 as a process flow diagram. At 1110, the method can begin with a pupil, e.g., first pupil 610.

At 1120, the method can include determining overlapped regions of the initial pupil based on the first DP. The method can then include generating the initial pupil to include only the most overlapped regions when including only the most overlapped regions meet or exceed a pupil fill ratio threshold. Determining the pupil fill ratio can include computing the area or fractional area covered by the pupil and comparing it to a desired pupil fill ratio (the pupil fill ratio threshold).

At 1130, a comparison can be performed to check if the initial pupil has a pupil fill ratio that meets or exceeds the pupil fill ratio threshold. If so, at 1140, the initial pupil can be generated with the selected portions of the second DP.

As shown at 1150, the method can iteratively add next most overlapped regions (e.g., adding adjacent regions 1010 of amplitude 3 as shown in the inset) to the pupil when the initial pupil does not meet or exceed the pupil fill ratio threshold. The subsequent comparisons are shown at 1160 where further regions of the first DP are added to the pupil until the pupil fill ratio threshold is met or exceeded.

Figure 12:
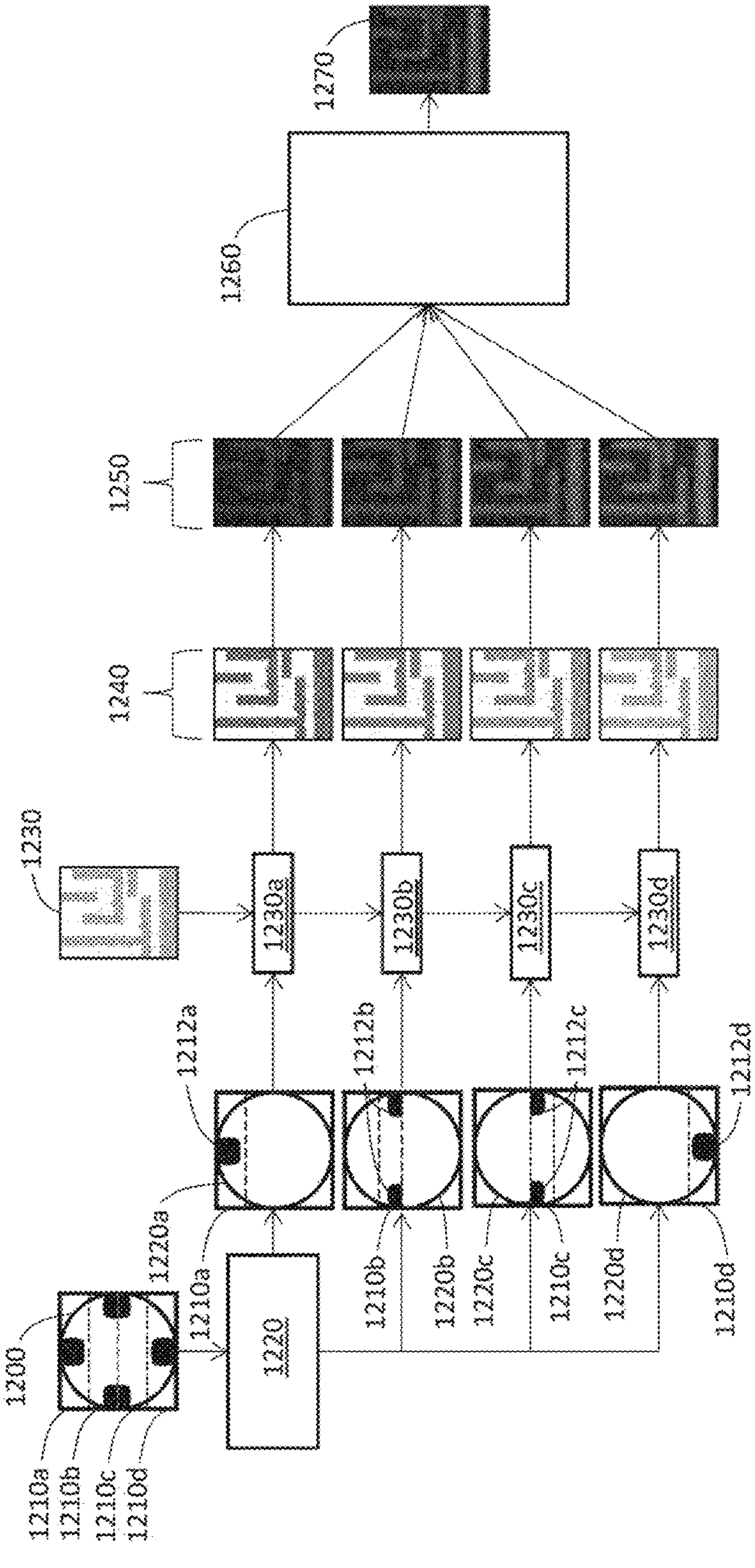
FIG. 12 illustrates an exemplary partitioning of a source and an initial pupil based on incident light angles to the mask, according to an embodiment of the present disclosure.

FIG. 12 illustrates an exemplary partitioning of a source and a pupil based on incident light angles to the mask, according to an embodiment of the present disclosure.

Because the source is not a point source (i.e., has a finite size), light arriving at the mask from the source arrives at different incident angles. Accordingly, during SMO, the accuracy of the aerial image resulting from the mask and a given pupil can be improved by utilization of the smaller incident angles resulting from the partitioning. When partitioning the source light into different incident angles, this can be represented by dividing the pupil into corresponding partitions in sigma space. One example of such is depicted in FIG. 12, showing pupil 1200 divided into four partitions 1210*a*, 1210*b*, 1210*c*, and 1210*d*. Each of the partitions can have some light in it, based on the determined pupil as described by any of the embodiments herein. As shown in FIG. 12, each region of the pupil can be decomposed (at 1220) into individual pupils (1220*a-d*) that have only the light present in the particular partition (1210*a-d*). The partitioned pupils can then be processed individually by the SMO process.

Utilizing mask 1230 at stages 1230*a-d* with corresponding pupils 1210*a-d*, corresponding mask transmittance images 1240 can be generated. Using a partitioned source model (e.g., a model that simulates light from a source partitioned as described above), a suitable projection optics model 32 and a suitable design layout model 35 (see, e.g., FIG. 2), partial aerial images 1250 may be simulated. The partial aerial images may then be incoherently added at 1260 (i.e., intensity of the partial aerial images added without any interference effect) to obtain the aerial image 1270 produced by the entire source pupil 1200. A similar process is described in U.S. 2018-0120709 A1, the contents of which are incorporated by reference in its entirety.

Figure 13:
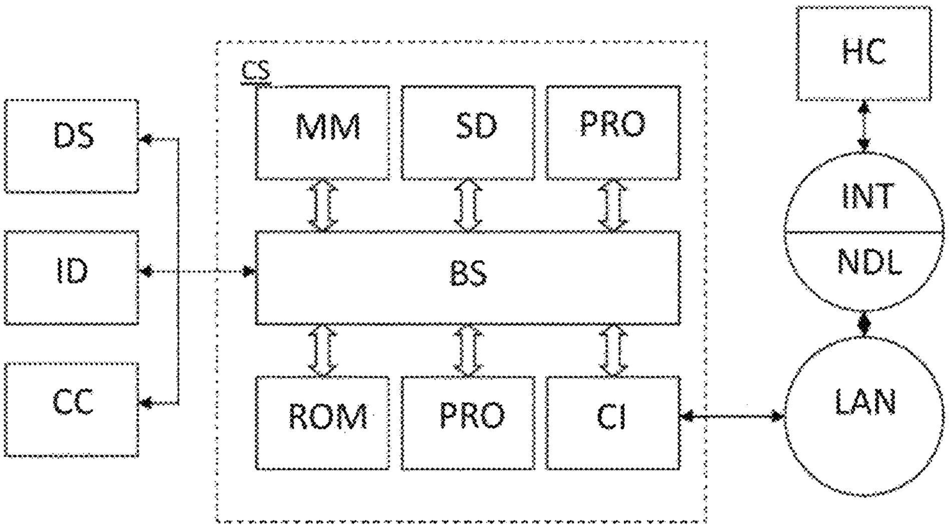
FIG. 13 is a block diagram of an example computer system, according to an embodiment of the present disclosure.

FIG. 13 is a block diagram of an example computer system CS, according to an embodiment of the present disclosure.

Computer system CS includes a bus BS or other communication mechanism for communicating information, and a processor PRO (or multiple processor) coupled with bus BS for processing information. Computer system CS also includes a main memory MM, such as a random-access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 14:
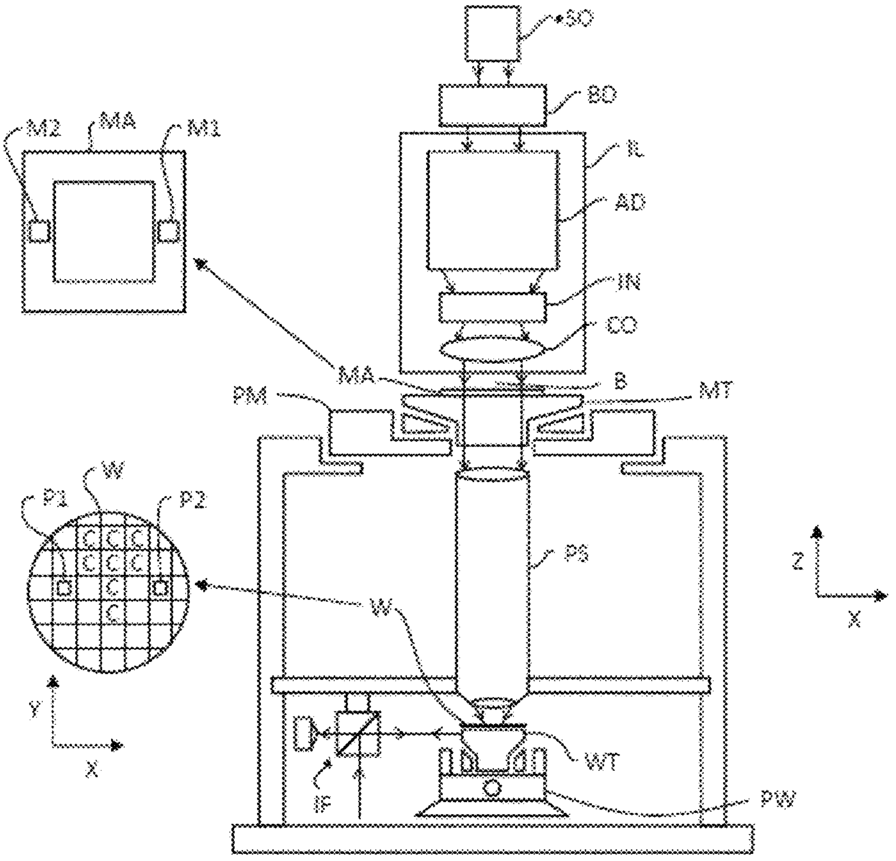
FIG. 14 is a schematic diagram of a lithographic projection apparatus, according to an embodiment of the present disclosure.

FIG. 14 is a schematic diagram of a lithographic projection apparatus, according to an embodiment of the present disclosure.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g., so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 15:
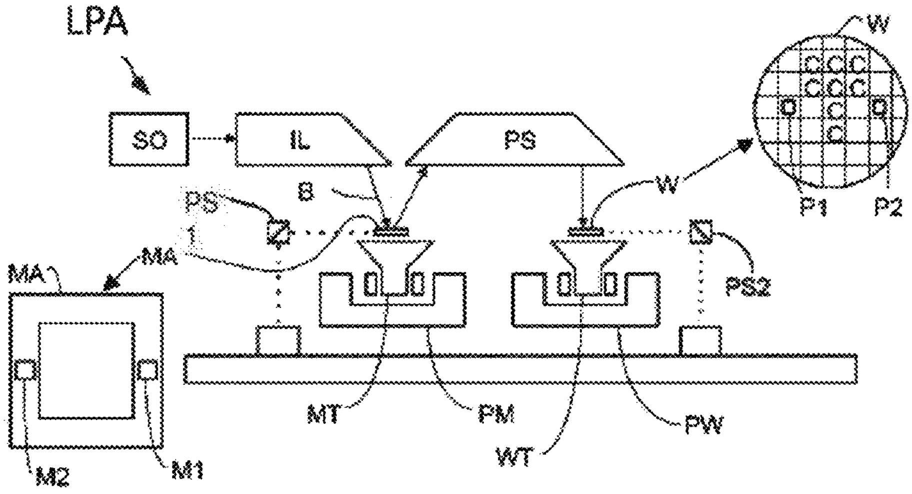
FIG. 15 is a schematic diagram of another lithographic projection apparatus, according to an embodiment of the present disclosure.

FIG. 15 is a schematic diagram of another lithographic projection apparatus (LPA), according to an embodiment of the present disclosure.

LPA can include source collector module SO, illumination system (illuminator) IL configured to condition a radiation beam B (e.g., EUV radiation), support structure MT, substrate table WT, and projection system PS.

Support structure (e.g., a patterning device table) MT can be constructed to support a patterning device (e.g., a mask or a reticle) MA and connected to a first positioner PM configured to accurately position the patterning device;

Substrate table (e.g., a wafer table) WT can be constructed to hold a substrate (e.g., a resist coated wafer) W and connected to a second positioner PW configured to accurately position the substrate.

Projection system (e.g., a reflective projection system) PS can be configured to project a pattern imparted to the radiation beam B by patterning device MA onto a target portion C (e.g., comprising one or more dies) of the substrate W.

As here depicted, LPA can be of a reflective type (e.g., employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultraviolet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g., patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g., patterning device table) MT and the substrate table WT are scanned synchronously while a pattern imparted to the radiation beam is projected onto target portion C (i.e. a single dynamic exposure). The velocity and direction of substrate table WT relative to the support structure (e.g., patterning device table) MT may be determined by the (de-)magnification and image reversal characteristics of the projection system PS.

In stationary mode, the support structure (e.g., patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array.

Figure 16:
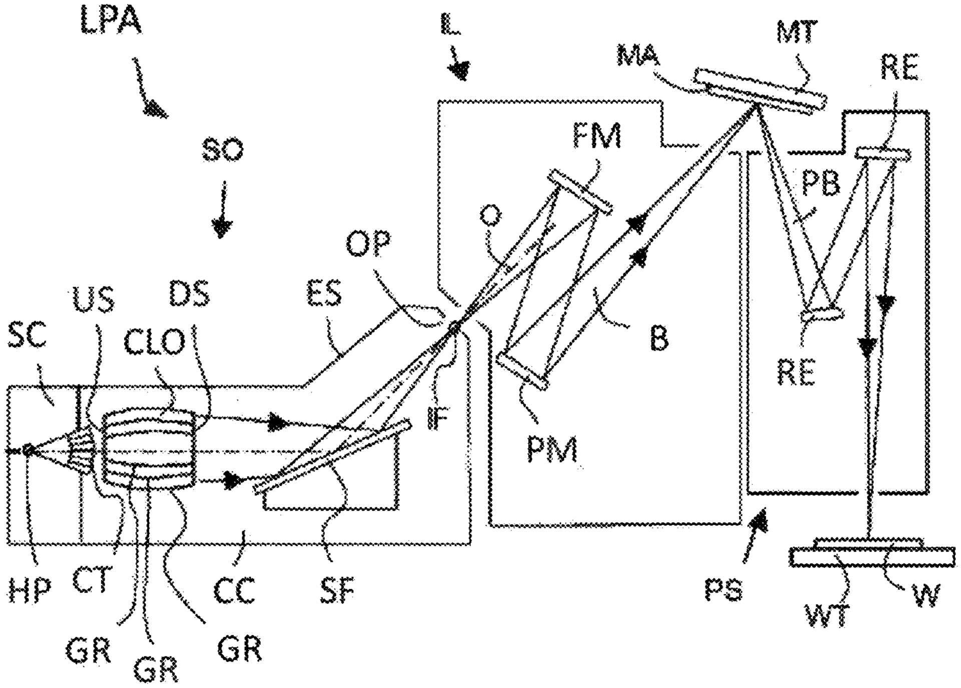
FIG. 16 is a detailed view of the lithographic projection apparatus, according to an embodiment of the present disclosure.

FIG. 16 is a detailed view of the lithographic projection apparatus, according to an embodiment of the present disclosure.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CLO which may be a so-called grazing incidence collector. Radiation collector CLO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device PM arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CLO can be a nested collector with grazing incidence reflectors GR, just as an example of a collector (or collector mirror). The grazing incidence reflectors GR are disposed axially symmetric around the optical axis O and a collector optic CLO of this type may be used in combination with a discharge produced plasma source, often called a DPP source.

Figure 17:
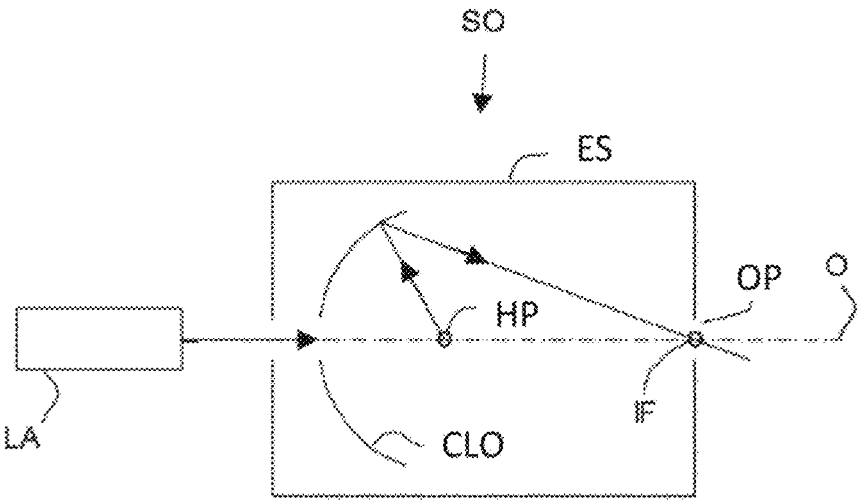
FIG. 17 is a detailed view of the source collector module of the lithographic projection apparatus, according to an embodiment of the present disclosure.

FIG. 17 is a detailed view of source collector module SO of lithographic projection apparatus LPA, according to an embodiment of the present disclosure.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CLO and focused onto the opening OP in the enclosing structure ES.

The concepts disclosed herein may simulate or mathematically model any generic imaging system for imaging sub wavelength features and may be especially useful with emerging imaging technologies capable of producing increasingly shorter wavelengths. Emerging technologies already in use include EUV (extreme ultraviolet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Embodiments of the present disclosure can be further described by the following clauses.

1. A method of determining a source for a lithography process comprising:
   - determining a first pupil having a central obscuration (CO);
   - determining a diffraction order (DO) based on a target design and a mask model;
   - determining a first diffraction pattern (DP) based on the DO and the first pupil, the first DP including overlapping regions of diffracted light;
   - determining a second DP based on the DO and the first pupil; and
   - determining an initial pupil based on the first DP and the second DP, the initial pupil including at least some of the overlapping regions.
2. The method of clause 1, further comprising performing source-mask-optimization (SMO) initialized with the initial pupil.
3. The method of clause 1, wherein the initial pupil does not include any of the diffracted light in the CO.
4. The method of clause 3, further comprising performing SMO with the constraint that any pupil resulting from the SMO excludes the CO.
5. The method of clause 1, wherein the first pupil is determined for a lithography system having a numerical aperture of at least 0.45 for an isomorphic system with a chief ray angle (CRAO) less than or equal to 9.
6. The method of clause 1, wherein the first pupil is determined for a lithography system having a numerical aperture of at least 0.5 for an anamorphic (4×8) lithography system.
7. The method of clause 1, wherein the central obscuration is a circle.
8. The method of clause 1, wherein the central obscuration is an oval.
9. The method of clause 1, wherein the central obscuration is a rectangle.
10. The method of clause 1, wherein the mask model is a thick mask model.
11. The method of clause 1, wherein the DO includes first order diffraction light at closest DO peak locations to a zeroth order DO peak location.
12. The method of clause 1, wherein the DO includes the closest first order diffraction light at DO peak locations orthogonal to the zeroth order DO peak location.
13. The method of clause 1, further comprising determining DO peak locations based on local peaks of a DO array, wherein the DO is determined based on the DO peak locations.
14. The method of clause 8, wherein amplitudes of the DO are based on the sums of all amplitudes in corresponding local DO areas.
15. The method of clause 1, wherein the initial pupil is contained within a sigma between −NA and +NA.
16. The method of clause 1, further comprising discretizing the DOs and utilizing the first pupil with a discrete amplitude to generate the second DP to have discretized amplitudes.
17. The method of clause 10, wherein the discrete amplitudes of the DOs and the first pupil are each set to 1
18. The method of clause 1, wherein the first DP indicates the number of overlapped diffraction beams.
19. The method of clause 1, wherein the initial pupil is determined based on a degree of overlap in the overlapping regions of the first DP.
20. The method of clause 12, further comprising:
   - generating a normalized DP based on the degree of overlap exceeding a threshold, wherein the overlapping regions that exceed the threshold for the degree of the degree of overlap are set to have a value of 1 and all other regions in the normalized DP are set to have a value of 0; and
   - multiplying the normalized DP by the second DP to generate the initial pupil.
21. The method of clause 1, wherein the initial pupil is determined based on a highest degree of overlap in the overlapping regions of the first DP.
22. The method of clause 1, further comprising determining DO amplitudes for the DO, wherein the initial pupil is filled where the summed amplitudes of the first DP exceeds a threshold of diffraction pattern overlap.
23. The method of clause 1, further comprising:
   - determining overlapped regions of the initial pupil;
   - generating the initial pupil to include only the most overlapped regions when including only the most overlapped regions meet or exceed a pupil fill ratio threshold; and
   - iteratively adding next most overlapped regions to the initial pupil when the initial pupil does not meet or exceed the pupil fill ratio threshold.

24. A non-transitory computer readable medium having instructions recorded thereon for determining a source for use with a lithographic process, the instructions when executed by a computer having at least one programmable processor cause operations comprising, the operations as in any of clauses 1-23.

25. A system for determining a source for use with a lithographic process, the system comprising:

at least one programmable processor; and a non-transitory computer readable medium having instructions recorded thereon, the instructions when executed by a computer having the at least one programmable processor cause operations as in any of clauses 1-23.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The combinations and sub-combinations of the elements disclosed herein constitute separate embodiments and are provided as examples only. Also, the descriptions above are intended to be illustrative, not limiting. Thus, it will be apparent to one skilled in the art that modifications may be made as described without departing from the scope of the claims set out below.

What is claimed is:

1. A non-transitory computer readable medium having instructions recorded thereon or therein, the instructions, when executed by one or more processors, configured cause the one or more processors to at least:

determine a first pupil having a central obscuration (CO);

determine a diffraction order (DO) based on a target design and a mask model;

determine a first diffraction pattern (DP) based on the DO and the first pupil, the first DP including overlapping regions of diffraction patterns;

determine a second DP based on the DO and the first pupil; and determine an initial pupil for a lithography process based on the first DP and the second DP, the initial pupil including at least some of the overlapping regions.

2. The medium of claim 1, wherein the instructions are further configured to cause the one or more processors to perform source-mask-optimization (SMO) using the initial pupil.

3. The medium of claim 1, wherein the initial pupil does not include any of the diffracted radiation in the CO.

4. The medium of claim 1, wherein the first pupil is determined for a lithography system having a numerical aperture of at least 0.45 for an isomorphic system with a chief ray angle (CRAO) less than or equal to 9°, or determined for a lithography system having a numerical aperture of at least 0.5 for an anamorphic (4×8) lithography system.

5. The medium of claim 1, wherein the mask model is a thick mask model.

6. The medium of claim 1, wherein the DO includes first order diffraction radiation at closest DO peak locations to a zeroth order DO peak location.

7. The medium of claim 1, wherein the DO includes the closest first order diffraction radiation at DO peak locations orthogonal to the zeroth order DO peak location.

8. The medium of claim 1, wherein the instructions are further configured to cause the one or more processors to determine DO peak locations based on local peaks of a DO array, wherein the DO is determined based on the DO peak locations, wherein amplitudes of the DO are based on the sums of all amplitudes in corresponding local DO areas.

9. The medium of claim 1, wherein the initial pupil is contained within a sigma between −NA and +NA.

10. The medium of claim 1, wherein the instructions are further configured to cause the one or more processors to discretize the DO and utilize the first pupil with a discrete amplitude to generate the second DP to have discretized amplitudes.

11. The medium of claim 1, wherein the first DP indicates the number of overlapped diffraction beams.

12. The medium of claim 1, wherein the initial pupil is determined based on a degree of overlap in the overlapping regions of the first DP.

13. The medium of claim 12, wherein the instructions are further configured to cause the one or more processors to:

generate a normalized DP based on the degree of overlap exceeding a threshold, wherein the overlapping regions that exceed the threshold for the degree of overlap are set to have a first value and all other regions in the normalized DP are set to have a second, different value; and multiply the normalized DP by the second DP to generate the initial pupil.

14. The medium of claim 1, wherein the instructions are further configured to cause the one or more processors to determine DO amplitudes for the DO, wherein the initial pupil is filled where the summed amplitudes of the first DP exceeds a threshold of diffraction pattern overlap.

15. The medium of claim 1, wherein the instructions are further configured to cause the one or more processors to:

determine overlapped regions of the initial pupil;

generate the initial pupil to include only the most overlapped regions when including only the most overlapped regions meet or exceed a pupil fill ratio threshold; and iteratively add next most overlapped regions to the initial pupil when the initial pupil does not meet or exceed the pupil fill ratio threshold.

16. A method comprising:

determining a first pupil having a central obscuration (CO);

determining a diffraction order (DO) based on a target design and a mask model;

determining a first diffraction pattern (DP) based on the DO and the first pupil, the first DP including overlapping regions of diffraction patterns;

determining a second DP based on the DO and the first pupil; and determining, by a hardware computer, an initial pupil for a lithography process based on the first DP and the second DP, the initial pupil including at least some of the overlapping regions.

17. The method of claim 16, further comprising performing source-mask-optimization (SMO) using the initial pupil.

18. The method of claim 16, wherein the initial pupil does not include any of the diffracted radiation in the CO.

19. The method of claim 16, wherein the first pupil is determined for a lithography system having a numerical aperture of at least 0.45 for an isomorphic system with a chief ray angle (CRAO) less than or equal to 9°, or determined for a lithography system having a numerical aperture of at least 0.5 for an anamorphic (4×8) lithography system.

20. The method of claim 16, wherein the DO includes first order diffraction radiation at closest DO peak locations to a zeroth order DO peak location.

* * * * *